US012742076B2

(12) United States Patent
Moore

(10) Patent No.: US 12,742,076 B2
(45) Date of Patent: Sep. 22, 2026

(54) WATER WASHABLE THERMAL AND PLASMA RESISTANT COATING FOR LASER INTERACTIVE APPLICATIONS

(71) Applicant: John Cleaon Moore, Camarillo, CA (US)

(72) Inventor: John Cleaon Moore, Camarillo, CA (US)

( * ) Notice: Subject to any disclaimer, the term of this patent is extended or adjusted under 35 U.S.C. 154(b) by 1369 days.

(21) Appl. No.: 17/433,177

(22) PCT Filed: Feb. 25, 2020

(86) PCT No.: PCT/US2020/019623

§ 371 (c)(1),
(2) Date: Aug. 23, 2021

(87) PCT Pub. No.: WO2020/176457

PCT Pub. Date: Sep. 3, 2020

(65) Prior Publication Data

US 2022/0145098 A1 May 12, 2022

Related U.S. Application Data

(60) Provisional application No. 62/811,484, filed on Feb. 27, 2019.

(51) Int. Cl.

| | |
|---|---|
| ***C09D 5/32*** | (2006.01) |
| ***B23K 26/18*** | (2006.01) |
| ***B23K 26/364*** | (2014.01) |
| ***B23K 26/402*** | (2014.01) |
| ***B23K 101/40*** | (2006.01) |
| ***B23K 103/00*** | (2006.01) |
| ***C08K 5/42*** | (2006.01) |
| ***C09D 5/00*** | (2006.01) |
| ***C09D 7/20*** | (2018.01) |
| ***C09D 7/63*** | (2018.01) |
| ***C09D 167/00*** | (2006.01) |
| ***C09D 179/02*** | (2006.01) |
| ***H10P 52/00*** | (2026.01) |

(52) U.S. Cl.

CPC ................ *C09D 5/32* (2013.01); *B23K 26/18* (2013.01); *B23K 26/364* (2015.10); *B23K 26/402* (2013.01); *C09D 5/008* (2013.01); *C09D 7/20* (2018.01); *C09D 7/63* (2018.01); *C09D 167/00* (2013.01); *C09D 179/02* (2013.01); *B23K 2101/40* (2018.08); *B23K 2103/42* (2018.08); *C08K 5/42* (2013.01); *H10P 52/00* (2026.01)

(58) Field of Classification Search

CPC . C09D 5/008; C09D 5/32; C09D 7/20; C09D 7/63; C09D 167/00; C09D 179/02; C08K 5/42; B23K 26/18; B23K 26/364; B23K 26/402

See application file for complete search history.

(56) References Cited

U.S. PATENT DOCUMENTS

| | | | | |
|---|---|---|---|---|
| 5,332,861 | A * | 7/1994 | Guglielmetti | D06L 4/664 562/87 |
| 6,011,085 | A * | 1/2000 | Maxwell | C08K 5/0041 524/358 |
| 9,090,783 | B2 | 7/2015 | Takanashi et al. | |
| 9,790,407 | B2 * | 10/2017 | Moore | C09J 133/26 |
| 10,002,758 | B2 * | 6/2018 | Moore | H01L 21/6835 |
| 2018/0342422 | A1 | 11/2018 | Li et al. | |
| 2019/0006295 | A1 * | 1/2019 | Tadano | H01L 21/78 |

FOREIGN PATENT DOCUMENTS

KR 10-1735808 B1 5/2017

OTHER PUBLICATIONS

Zawa et al., Debris-free high-speed laser-assisted low-stress dicing for multi-layered MEMS, IEEJ Transactions on Sensors and Micromachines, vol. 129, No. 3, 2009. pp. 63-68.

* cited by examiner

*Primary Examiner* — Bijan Ahvazi

(74) *Attorney, Agent, or Firm* — D'Ambrosio & Menon, PLLC; Usha Menon

(57) ABSTRACT

Compositions and methods useful for the singulation of fragile devices from substrates by the process of plasma singulation are described. Thermal resistant coatings comprising ingredients that exhibit both thermal resistance and water solubility are demonstrated. These ingredients which have high ultraviolet interaction allow laser interaction to create masks for thin and small devices, for example, substrates that are thin to 150 microns or less or have devices present that are measured 1 mm on a side or smaller. Methods are presented which apply the composition to the inorganic substrate whereby an ultraviolet sourced laser interacts with the surface and creates a mask which subsequently is processed in a plasma chamber to separate (singulate) the devices within the substrate and subsequently rinse with water to remove/dissolve the laser interactive and plasma protective layer. Once rinsed and clean, the devices proceed by pick and place tooling to final integration to electronic circuitry. The invention coating is a water rinsable creation that achieves high selectivity for both laser and plasma operations.

11 Claims, No Drawings

WATER WASHABLE THERMAL AND PLASMA RESISTANT COATING FOR LASER INTERACTIVE APPLICATIONS

FIELD OF THE INVENTION

This invention relates to an applied coating or film onto substrates by a variety of means whereby it protects the underlying features from the effects of thermally induced laser impinging and plasma etching operations while simultaneously permitting its removal by washing with water. More specifically, the invention describes the composition of a coating or film which comprises a thermal resistant water soluble polymer and a thermal resistant and water soluble ultraviolet light absorbing compound. When combined and applied to a substrate to form a coating or film, the invention provides high interaction with certain laser light to allow patterning at low energies without deleterious effects to underlying features while also providing subsequent high resistance to plasma chemistries. The coating has many useful benefits in simplifying and reducing the cost of microelectronic manufacturing, including its aiding the separation of small devices by plasma singulation, having a high degree of compatibility with materials due to its simple removal/rinsing by the use of water, and the elimination of creating a hazardous waste.

BACKGROUND OF THE INVENTION

This invention relates to a process of separating electronic devices by laser assisted plasma singulation. This approach is based upon creating an organic mask by laser interaction with a coating on the substrate surface, whereby laser processing aligns with device streets, the substrate is then exposed to a chemical plasma that etches into those same streets opened or cleared by a laser, while other regions are protected. Upon completion of the plasma step, the coating mask is washed with water to present clean devices that are singulated and ready to be removed and assembled into an electronic circuit. This invention of high temperature and water washable coatings which are highly interactive with laser light of a given wavelength allows the process of laser assisted plasma singulation to be conducted in a simple and low cost manner.

Candidate electronic substrates that are a match for laser assisted plasma singulation include those being thin (e.g., 200 microns or less), having small die (e.g., 1-2 mm on an edge), and fragile (e.g., gallium arsenide). The trend of reducing die and street size allows more die to be created per wafer resulting in lower manufacturing costs per die. While the majority of die singulation is conducted by mechanical sawing, the introduction of lasers has improved the dicing ("sawing") process through "laser dicing". These improvements include reduced chipping, cracking, stress, and die loss due to failed film frame tape adhesion. An example of laser assisted mechanical sawing, otherwise referred to as laser dicing, is described in the US patent by Takanishi et al. and assigned to Tokyo Ohka Kogyo Co., LTD. and Disco Corporation (U.S. Pat. No. 9,090,783 B2), where a water soluble resin and an ultraviolet absorber (UVA) make up the coating. This invention describes the resin to be chosen from several low temperature water soluble types with polyvinyl alcohol (PVA) demonstrated in the examples and the final composition to include UVA anywhere from 0.01 to 10 parts mixed with 100 parts of the water soluble resin, assumed to be PVA (e.g., UVA=0.009%-9.09%, PVA as balance). This same composition is also chosen for the laser interacting coating described in the US application by Takanishi et al. and assigned to Tokyo Ohka Kogyo Co., LTD. and Disco Corporation (US 2006/0105544 A1, application Ser. No. 11/251,810). The US application by Sekiya (US 2004/0112880 A1, application Ser. No. 10/721,234) describes a laser machining method using a water soluble resist produced by Tokyo Ohka Kogyo Co., LTD., however, no UVA is present. Those familiar in the art of laser interaction with coatings, can support the statement that coatings prepared without appropriate radiation absorbers of a given wavelength preference for absorption will produce less than satisfactory performance interaction with the laser of a given similar emission wavelength as the absorption character of the UVA.

These filings describe the process of laser dicing as performed by affixing a completed semiconductor wafer containing finished devices to adhesive tape mounted on a ring (film frame tape) and coated with a simple low temperature resistant water washable coating and UVA, for example, the compositions described in filings U.S. Pat. No. 9,090,783 B2 and US 2006/0105544 A1, application Ser. No. 11/251,810, describe polyvinyl alcohol (PVA)+UVA. Once the coating based upon PVA and UVA is formed, a high power laser proceeds across the surface to pass through the organic coating and penetrates deep into the substrate, creating a laser cut well or trench into the substrate. This well or trench continues across the wafer until all streets separating the devices have been exposed and cut. Once completed, sawing proceeds or the substrate can be water washed with a high pressure spray. For sawing operations to realize the full benefit of the laser interaction, the saw blade is carefully inserted within the laser well or trench that was formed. The saw blade travels further into the pre-cut space until the blade passes through the wafer to complete the cut. This process is repeated for all wafer streets. When finished, the diced wafer experiences a final water rinse and is dried leaving the diced and clean die on the adhesive tape (film frame tape) to be removed by pick and place tooling.

At the time of this writing, laser dicing represents the process of record for the majority of the semiconductor market. There continues to be observed chipping and irregularities, as well as lost die due to vibratory action of the saw causing pulling and pushing small die from the adhesive carrier (film frame tape). These issues become expressed in a customer's bottom line as yield loss. Yield loss is especially significant for extremely thin and small die at the dimensions mentioned earlier or even smaller. Microelectronics manufacturing continues to trend towards thinner and smaller die and with this trend, yield loss trends upward with existing practices, albeit conventional sawing, laser dicing, or other manufacturing practices.

As the dimensions of thin and tiny die trend smaller, they become candidates for laser assisted plasma singulation. The process flow is similar to that described for laser dicing, namely, coating+cutting+washing. However, plasma etching replaces a mechanical saw for die separation (singulation). For plasma etching, there is no need for laser penetration into the substrate street area to produce a well or trench to allow the saw to operate without creating chipping or cracks. Since plasma etching is a non-mechanical process, there is little or no concern for chipping or cracking of the substrate. Plasma etching is a passive process as compared to an active mechanical dicing approach. The purpose of the laser is simply to create a mask in the surface coating and open up the streets to allow the plasma chemistry to penetrate and proceed down into the substrate in an anisotropical fashion.

Ideally, the laser should be tuned down in an energy sufficient to break through and clear the organic layer with little or no interaction with the substrate. To this end, it is desirable for a coating to effect maximum laser interaction and maximum plasma resistance. Desired coating compositions use high temperature resistant materials including significant amounts of ultraviolet absorption compound (UVA). These high temperature resistant coatings exhibit barrier properties to the plasma chemistry used to etch deep into the silicon. Such high temperature resistant compositions that interact favorably with laser radiation are measured by their etch selectivity rates, calculated as the ratio of the etch rate for the substrate vs. the etch rate (erosion rate) for the organic coating. It is always desired to observe a high selectivity for the etch species of interest.

When calculating plasma etch selectivity for silicon substrate, acceptable observed values of Si removal vs. erosion of the organic coating mask is commonly represented as Si:mask as 200:1, where 200 microns of Si are etched (removed) for a given mask erosion of 1 micron. More preferred is a value of 500:1 for Si:mask, and most preferred is 1,000:1, or greater. The higher selectivity that is offered for a given mask, that material is considered to be a plasma barrier. Another selectivity calculation which common expresses lower values is that when descum and breakthrough steps are included. These steps typically precede a plasma etch process. Descum and breakthrough remove any potential polymer residue to fully expose the substrate and prepare it for mainstream plasma etching. The plasma chemistry may be adjusted to highlight polymer (carbon containing species) during descum and breakthrough steps. Plasma etch chemistry designed to remove polymer is commonly highly concentrated in oxygen, for oxidizing carbon species to carbon dioxide and moisture. This process is conducted slower, more of a surface "polish" to clean. Once determined as clean and ready for substrate etching, the system shifts chemistry to that specific for the substrate. In the case of silicon (Si), etch chemistry may include a fluorine chemistry mixed with a slight amount of oxygen to maintain the silicon conversion reaction.

Calculations of selectivity that take into account the total process that includes both descum and breakthrough are commonly lower values; in some cases, these can be much lower. One explanation is that common mask thickness is 2-4 microns. Descum and breakthrough processing in a highly oxidizing plasma can erode mask coatings and reduce their thickness at a rate much higher than during a focused substrate etching step. When calculating selectivity of plasma processes of species silicon that include the descum and breakthrough steps acceptable observed values of Si removal vs. 1 micron of the organic coating mask as erosion, also represented as Si:mask may be >25:1, for a corresponding condition whereby 25 microns of Si are etched (removed) for a given mask erosion+descum+breakthrough at 1 micron. A more preferred is a value is >50:1 for Si:mask, where mask loss is measured as erosion+descum+breakthrough at 1 micron. Most preferred is a value of >100:1, where mask loss is measured as erosion+descum+breakthrough at 1 micron.

A plasma singulation process is described in the US application by Li et al. (US 2018/0342422 A1, application Ser. No. 15/606,456), assigned to Applied Materials, Inc. The filing describes a light absorbing mask which is patterned by laser interaction to the mask and followed by plasma etching of the open gaps while the remaining masked areas protect a semiconductor wafer. In this application, the mask is further described to comprise a solid component, a light absorber species, and the addition of particles. The solid component is identified as PVA, along with other related low-temperature resins. Embodiments are mentioned whereby the mask is intentionally heated to temperatures near 130 degrees centigrade in order to achieve improved substrate protection from subsequent plasma etching. While heating to this temperature, the coating has been shown to provide improved protection from the plasma chemistry, PVA will crosslink and prevent dissolving and cleaning into room temperature DIW.

While PVA and polyvinylpyrrolidone (PVP) may be used for conventional low temperature resistant processes, however, these products lose their water solubility when subjected to high temperature. Conditions involving 100 degrees centigrade in direct contact with reactive metals as Cu, Ni, Pt, Ti, Sn, and alloys thereof are known to trigger polymer crosslinking. More serious are conditions in a plasma etching process whereby oxygen is present with other species that are ionized by a high voltage and begin etching of the substrate, as in the case of gallium arsenide, silicon, or related semiconductor materials. During plasma etching, the substrate temperature can rise beyond 100 degrees centigrade and often exceed 150, or even 200 degrees centigrade. For any given plasma system, the actual temperature is dependent upon the chosen etching rate (i.e. singulation process). With the demand for faster processes, higher etch rates are needed, which in turn, produce higher plasma processing temperatures. As these are chemical processes, many interactions exist. The main effects of plasma chemistry comprising oxygen and aggressive fluorinated agents, the underlying metals, with temperature, all taken together contribute to significant catalyzing and reactive conditions. Should there be present a protective polymer, albeit a water washable protective polymer, the expectation is that polymer will incur crosslinking. In fact, many who practice in the art of plasma etching desire a protective polymer mask to be as dense and impermeable as possible, a condition not unlike many crosslinked polymeric systems as seen in photoresist. The use of conventional organic solvent based photoresist is to create patterned masks in plasma etching processes. The photoresist masks are often made further resistant to the plasma by high temperature baking just before processing. This baking step is intended to densify, and in some cases, crosslink the photoresist and improve its barrier properties. While use of organic solvent based photoresist and additional baking steps may create improved protection to the underlying substrate from the plasma, these measures create cleaning challenges when finished.

Recognizing that plasma chemistry, substrate metals, and temperature will individually contribute to polymer crosslinking, the combination of these effects creates a more serious challenge to clean temporary coatings used as masking agents. Surprisingly, it is all too common to observe the use of coatings created from PVA and PVP for plasma etching processes. Even under controlled laboratory conditions with highly tuned processes, PVA and PVP will crosslink and create cleaning challenges, producing residue which can be virtually impossible to remove without resorting to aggressive cleaning methods involving high pressure spraying or the use of organic solvents. High pressure spraying consumes a great deal of water, which must be replaced with new, causing an additional energy demand. When using organic solvents, these materials create unwanted hazardous waste which presents environmental concerns, worker exposure, and management costs. Crosslinked PVA and PVP cannot be dissolved or removed by simply water washing. Even in laser machining, which by its nature produces heat when in contact with the substrate, subsequent washing of coated substrates are a challenge. A laser relies upon localized heat production at the point of substrate contact, the heat activation zone (HAZ), whereby the heat creates phase change in the substrate and marks or cuts into the material. Within the HAZ, most organic materials are burned and evaporated when using a high energy laser. At the boundaries (edges) of the HAZ, the polymer coating may mix with molten substrate material and create a crosslinked residue.

As is often the case with plasma dicing, low energy laser patterning of a plasma resistant coating is used to create a mask. While low temperature resistant masks created from water washable coatings as PVA and PVP may be satisfactory to support low energy laser patterning, these masks lose their water solubility during plasma processing and produce a crosslinked residue that is difficult or impossible to remove. While the chemistry of and propensity towards crosslinking is known, PVA and PVP may be reserved for conventional water rinsing, but are not suitable to stand up to plasma processing. Using PVA and PVP is anticipated to produce low process yields and a need for costly cleaning practices. Yield loss can also be worsened by high pressure washing. Mechanically aggressive washing of sliced substrates with small die that approach 1 mm on a side or below commonly lose their adhesion to a tape film. When using masks based upon PVA and PVP, yield loss from lost die during washing (mechanically pushed-off the tape) add to yield loss from immovable (non-dissolvable) residues.

Based upon the challenges presented here, there is a clear and compelling need to use high temperature resistant water washable polymers as masking agents for laser and plasma processing. A further need exists to simplify the cleaning aspect of using water washable coatings for laser machining and plasma processing.

There is a continuing need for improved "green" processing of device substrates in microelectronic manufacturing. A green process and the associated chemistries are those which reduce or eliminate the use and generation of hazardous substances. According to the American Chemical Society's Green Chemistry Institute, there are twelve (12) principles which help to define a green chemistry. Replacing substances which require organic solvents or that require excessive amounts of water or energy to clean and finish the process is desirable. It is desirable to reduce costs of new processes in manufacturing and to reduce the environmental and regulatory restrictions on equipment and materials usage aspects of new processes. High temperature and stable polymers for use as masking agents will maintain their water solubility in laser machining and plasma processing. Simplifying processes by maintaining water washing ability of the mask that is associated to the laser machining and plasma processing method is desirable.

For laser machining and/or plasma processing, there is a need for high temperature resistant polymers for use as masks to reduce the need for aggressive cleaning equipment and reduce complexity and costs of manufacturing. There is a continuing emphasis in manufacturing electronics and micro-electro-mechanical systems (MEMS) devices to be green through reducing water usage, minimizing waste, and conserving energy. Taken together, there is a pressing need to provide a consistent and universal process, which uses a composition that incorporates a high temperature resistant polymer, provides high performance, high throughput, a green process, all at a reduced cost of ownership.

SUMMARY OF THE INVENTION

It is an object of this invention to provide a multi-functional composition, which exhibits minimum desirable characteristics for coating an inorganic substrate, having a high degree of interaction with a laser by means of absorption of light of a given wavelength within the ultraviolet region preferred between 340 nm and 370 nm, and facilitating a water rinse cycle to sufficiently remove the coating from the inorganic substrate following interaction with such laser.

It is another object of this invention to provide a coating which exhibits protection to the underlying substrate features from the effects of a chemical plasma during aggressive etching and heating conditions for a period of time sufficient to complete the practice of singulating (separating) the substrate devices, removing the protective coating by rinsing with water, and following with the exposure to such plasma chemistry.

It is a further object of the invention to provide a composition and universal method which operate interdependently to provide performance conditions that maintain water rinsing providing simplicity by eliminating process steps, reducing the use of organic chemicals, and improving compatibility with other process materials such as tape on film frame, and eliminating the generation of hazardous waste.

These objects, and other objects which will become apparent from the description which follows, are achieved by the multi-functional composition of the invention where the solids comprise a mixture of:

(a) an ultraviolet absorbing compound that exhibits both thermal resistance and water solubility, where thermal resistance of the ultraviolet absorbing compound is defined as having a melting point >200 degrees centigrade;

(b) at least one thermoplastic polymer resin that exhibits both thermal resistance and water solubility, where the thermal resistance of the thermoplastic water soluble polymer is defined as having a melt viscosity of >5,000 centipoise at 200 degrees centigrade;

wherein component (a) is present in the amount of about 1 percent to about 70 percent by weight, and component (b) is present in an amount of about 30 percent to about 99 percent by weight, said percent of ultraviolet absorbing compound and said thermoplastic polymer are based upon the total weight of the solids taken as 100% by weight.

Additional compounds may include a thermal resistant water soluble rinse aid. Such compounds include alkali salts of para-styrenesulfonate (p-styrenesulfonate), including, sodium, potassium, lithium, ammonium, and amino versions. Other compounds that act as rinse aids include polystyrenesulfonate of various homopolymers.

The invention also comprises a method for coating and protection of an inorganic substrate during laser interaction to produce a mask followed by subsequent plasma etching of the exposed regions created by such laser interaction to effect singulation (separation) of the substrate devices, and such plasma exposed coating is effectively rinsed away with water.

The compositions and methods have particular applicability to semiconductor wafer fabrication, for example, in the singulation of die from one another when mounted to film frame tape. The singulation of die is conducted by plasma etching within a vacuum chamber is preferred as a passive means to separate die. The passive separation of die by plasma etching provides higher yielding processing as compared to conventional sawing practice which exhibits vibration to produce chipping and loss of adhesion to the film frame tape for small die. Once successful singulation occurs, subsequent pick and place tooling removes each die individually. The compositions and methods are particularly suitable for small die or fragile substrates.

The terms "singulating" and "separating" are used interchangeably throughout this specification. Likewise, the terms "singulation" and "separation" are used interchangeably. The indefinite articles "a" and "an" are intended to include both the singular and the plural. All ranges are inclusive and combinable in any order except where it is clear that such numerical ranges are constrained to add up to 100%. The term "wt %" means weight percent based on the total weight of the coating composition, unless otherwise indicated.

While the present invention provides washable coating compositions and a method which can effectively coat, laser interact, plasma protect, and water wash a substrate, they are particularly adapted for plasma singulation die from thin and fragile wafers. These washable coatings are employed in the fabrication of substrates, for example, the singulation of electronic devices within substrates such as wafers or flat panel displays, which may include various layers and structures such as metal, semiconductor, and the associated organic materials. Typical substrate materials include, for example, semiconductor materials such as silicon, gallium arsenide and indium phosphide and sapphire, as well as glass and ceramic.

DETAILED DESCRIPTION OF THE INVENTION

The present subject matter describes a liquid form composition that is applied to microelectronic substrates by a variety of techniques, is dried to a coating or film, is subsequently interacted upon by a laser of a given wavelength between 340 nm and 370 nm within the ultraviolet region, resulting in a patterned mask whereby the substrate is sent to a plasma chamber where the open areas created by the laser are etched until complete singulation (separation) of device die is achieved, followed by water rinsing (dissolving) of the coating mask. The washable coating may be applied to a wide range of topographies on the substrate surface and is not limited by the dimension or shape of the substrate. This washable coating is a major simplification to microelectronic processing by replacing the need for organic solvent soluble photoresists, eliminating organic solvents to clean photoresist, and ensuring compatibility with film frame tape as support during processing. The present subject matter also describes a significant improvement as a "green" initiative by eliminating large volumes of hazardous organic solvents normally used to clean photoresists used to coat and create masks on the substrate.

The invention coating comprises a blend of polymers combined with an ultraviolet absorption additive, which after a spin-coating application, dries to a film that is smooth and of high uniformity. Said application process with the invention exhibits a high level of rigidity and adhesive strength, which taken together, is suitable for handling by robotic equipment, laser impingement, and subsequent plasma processing. The derived properties are necessary for successful laser interaction by chemical absorption. Depending upon the preferred invention formula, maximum energy conveyance from the laser to the material is tuned and a process is chosen to provide excellent channel/trench formation without the need for multiple cycles. The remaining washable coating within the defined mask areas is highly resistant to plasma etching. The invention's design with high thermal resistant and water washable products allows a simple process to be created. The ability of the composition and method to meet the desired critical objectives is regarded as representing the unique character of the invention.

Coatings are film-forming substances, which protect a substrate against potentially damaging elements as well as enhancing its appearance. This invention describes the composition and process of a temporary coating. Such coatings are applied, processed, and washed away without harm to the substrate. The wash or rinse medium used for the subject applications is water. The key processes of interest for water washable coatings include barrier layers, laser processing, and plasma dicing. The chemistry of water washable coatings may include surfactants and salts, however, few materials exist as both film formers and exhibit thermal resistance. For example, the products polyvinyl alcohol (PVA) and polyvinyl pyrrolidone (PVP) exhibit excellent film-forming character by molecular arrangement and the close molecular packing during a coating process. These products are commonly cast from water and retain trace water as a plasticizer to improve its properties and appearance.

Commercial availability of these products come in many forms with different functional groups added to the backbone of PVA or repeating units in PVP to give higher molecular weights. A common practice in manufacturing raw forms of PVA is to add acetate groups at periodic points in the carbon chain. Such additions create branching, where reactive groups extend from the main chain. Long chains of these molecules exist as random intermingled mixtures. The branching leads to chemical affinity between the chains, reactions, and to cross-linking, creating larger molecules with increased molecular weights, higher crystallinity and density. The final product exhibits increased thermal and chemical resistance and loses its ability to dissolve into water, a loss of water washing.

In practice, the monomers of both PVA and PVP contain functional groups that are reactive, are prone to oxidation, and will lead to cross-linking. This condition is desired for thermosetting polymers used in permanent applications. Crosslinking creates a network within the mixture that fixes the material into place. In washable coatings, cross-linking creates undesirable conditions, including increases in rheology (i.e. viscosity) leading to a premature expired product (i.e. low shelf life), loss in water solubility, and a permanent coating or at the very minimum, observed residue. Preventative practices to improve the shelf life of mixtures of PVA and PVP include cold storage, heat avoidance, avoidance to metals, and elimination of oxygen exposure.

Where thermal resistance is desired, polymers designed to resist heat are commonly observed to contain phenyl groups within their molecular backbone. These are characteristics shared by the water soluble polymers designed for film forming and protection, as well as the ultraviolet (UV) absorber (UVA). The water soluble polymers include polyester and oxazoline, while the UVA is based upon bis-stilbene chemistry. Another example of a water-soluble phenyl containing species is sulfonated polystyrene, a species occasionally used as an additive to raise thermal resistance and act as a water rinse aid. Alkali analogs of sulfonated polystyrene include, sodium, potassium, and lithium based styrene sulfonates, one such material that may be used in an exemplary embodiment is lithium styrene sulfonate (LiSS). These styrene sulfonate molecules exhibit thermal resistance to >500 degrees centigrade and remain water soluble.

The composition of the invention comprises a thermal resistant water soluble UVA, based upon the chemistry, bis-stilbene, a common fluorescent product used as optical brighteners. Desirable properties include absorption of UV light within the range 340 nm to 370 nm and a temperature resistance represented by a melting point >200 degrees centigrade, preferred to be >250 or even >300 degrees centigrade. Bis-stilbene properties and the derivatives of such products with high melting points are described in U.S. Pat. No. 3,984,399A (Weber, et al.). Some of the products described here exhibit high melting points (i.e. >250 degrees centigrade). Such materials with high melting point are expected to exhibit thermal resistance. The water soluble bis-stilbene candidates are alkaline conjugates of the same chemistry.

Preferred bis-stilbene fluorescent compounds exhibit corresponding molecular make-ups with the following formula:

$$R_1\text{—CH=CH—X—CH=CH—}R_2 \qquad (1)$$

whereby X represents a diphenyl group where the C(4) and C'(4) positions of the ring moiety binds to each of the respective —CH= extensions, and X contains a functional group as sulfonic, sulfone, carboxylic, nitrile, hydroxyl, mercapto, or methyl; $R_1$ and $R_2$ are independent, and each representing at least one phenyl group. While $R_1$ and $R_2$ may be different, they are preferred to be identical. Said functional groups sulfonic, sulfone, carboxylic, nitrile, hydroxyl, mercapto, or methyl may exist in pairs or may exist in as many positions as four (4) at positions of X and $R_1$ and $R_2$ and can exhibit identical pairs to create a certain symmetry in the molecule. In addition to the groups on the base formula indicated as (1), halogen substituents may also be present, preferable to be chlorine, bromine, or iodine.

Applicable bis-stilbene compounds are also described in U.S. Pat. No. 3,843,718 (Luethi), where preferred bis-stilbene fluorescent compounds exhibit corresponding molecular make-ups with the following formula:

$$PY_1Z_1OR_1\text{—CH=CH—X—CH=CH—}PY_2Z_2OR_2 \qquad (2)$$

whereby X represents a diphenyl group where the C(4) and C'(4) positions of the ring moiety binds to each of the respective —CH= extensions, and X contains a functional group as sulfonic, sulfone, carboxylic, nitrile, hydroxyl, mercapto, or methyl; P represents a phenyl group, $R_1$ and $R_2$ are alkyl with 5-18 carbons, substituted alkyl with 2-10 carbons, or alkenyl with 3-4 carbons; $Z_1$ and $Z_2$ are identical or different, denoting hydrogen, alkoxyl of 1-4 carbons, halogen, alkenyl with 3-4 carbons or alkyl with 1-4 carbons; and, $Y_1$ and $Y_2$ are identical or different, denoting hydrogen, alkoxyl of 1-4 carbons, halogen, alkenyl with 3-4 carbons or alkyl with 1-4 carbons.

Preferred bis-stilbene formulas of the described compounds described here as (1) and (2) include distyrylbiphenyl conjugates as mono and di-carboxylic acid, mono and di-sulfonic acid, and the partially or fully neutralized salts thereof as alkaline element sodium, potassium, or lithium versions including amine and amino organic versions. The more preferred is the sodium distyrylbiphenyl sulfonate. The most preferred is the disodium distyrylbiphenyl disulfonate. Such bis-stilbene derivatives are available for commercial use from the supplier, Milliken & Company, under the tradename Keyfluor™. The tradename product Keyfluor™ CBS-X is disodium distyrylbiphenyl disulfonate. Use of the Keyfluor™ product as the thermal resistant water soluble UV absorbing compound within the coating is 1-70%, preferred as 5-50%, and most preferred as 10-40%, being based upon the total weight of the solids being taken as % by weight.

The invention describes a UV absorption compound to be present within a polymer system that is coated onto the surface of the microelectronic substrate. The applied film is used to interact with a laser which exhibits are light source of given wavelength that overlaps the absorption range of the compound that is present within the polymer film. Molecular species which exhibit conjugated double bonds are most likely to absorb radiation of a given wavelength that corresponds to an excitation level of the electron present in a given orbital of the compound. The electron reaches its excited state then returns to its ground state and releases energy in the form of heat (conventional absorption) or releases light at a longer wavelength in the visible region (fluorescence). This molecular absorption is quantified by the Beer-Lambert law which relates absorption with the concentration of an absorbing species which radiation is being passed. The law is commonly represented as A=abc, explained as the absorption (A) through a medium of a given thickness (b), comprising a given concentration (c) of a radiation absorbing species, whereby that species exhibits an absorptivity (a) which relates the amount of light absorbed per mole of the given absorbing species of interest. For most laser applications whereby a coating is applied to a substrate and it is the goal for the underlying substrate to remain unharmed, maximum interaction is needed with the coating. When considering Beer's law, A=abc, to ensure (A) is maximized, it is of interest to maximize (a) and (c) for a given coating. While (b) is commonly intended to be minimized to <5 microns (μm), a chosen high absorptivity (a) species for the given wavelength of the laser (~355 nm) is of interest. For given conditions of the laser @ 355 nm, energy levels are driven further down as the concentration of the UV absorption species is increased as (c) in the Beer's law equation, A=abc. As concentration of the species is increased, the energy level for the laser can further be reduced to ensure its interaction with deep substrate effects are minimized. Minimum energy laser operations on the substrate surface are desired. The results are commonly evaluated by scanning electron microscopy (SEM) or similar whereby a cross-section of the coating is reviewed and compared between conditions of the coating and laser energy. Those SEM results that suggest the greatest effect as removed coating (cleared spacing) where the laser has travelled suggests the greatest conversion of laser energy being absorbed by the coating, clearing, without subsequent repeated laser cycling. The resulting cumulative effects is a mask or pattern of the coating as it exists on the substrate surface, areas removed whereby subsequent plasma operations will proceed while a coating exists on substrate areas desired to be protected from the effects of the plasma etching process.

Once the laser interacted mask is completed, the masked substrate proceeds to the plasma chamber where an etching chemistry is introduced that is specific for the substrate. It is a desire to etch the open areas of the mask completed to be able to separate individual substrate devices in a process classified as singulation. The substrate is affixed to a film frame tape, has been laser patterned to produce a mask, and is now proceeding to a plasma chamber whereby etching will proceed to separate the die while they remain adhered to the underlying tape adhesive. Following the plasma process, the die will be removed via equipment similar to a pick & place type of tooling.

Of particular interest to this invention are the protective properties of the coating or mask during which plasma etching is conducted. Etching of silicon is commonly performed in an environment of fluorine ion with a controlled amount of oxygen. This combination creates continued oxidation of the Si substrate and fluorine etching. Those experienced in the art of silicon etching express a wide variation of approaches to achieve complete etching of the exposed silicon locations on the substrate and are able to achieve this objective with minimal effect to the mask. The performance of a rate of silicon substrate etch as compared with the loss of the mask during the same process is identifies as selectivity, or the ratio of etch rate vs. erosion a the corresponding mask, normally represented as some number that is normalized to one (1). For example, it is well known that many organic solvent based photoresists used for this effort have selectivity values as 50:1, or preferred 100:1, or even more preferred >200:1, described as 200 microns of silicon removal for each 1 micron erosion of the photoresist mask. Therefore, most photoresists for this effort are deposited at thicknesses of <10 microns, as most substrate thicknesses are <500 microns, and even <150 microns for thin silicon wafers. The same applies to compound semiconductor substrates, however, gallium arsenide (GaAs) substrates are commonly much thinner, approaching 25 microns thickness. The chemistries used for these corresponding substrates include $CF_4$ or $SF_6$ and even with $SF_6$ mixed chlorine and fluorine; chlorine chemistries are most effective for GaAs, including $CCl_2F_2$, $SiCl_4/Cl_2$, and $BCl_3/Cl_2$ whereby etch rates >10 microns/min are possible. Oxygen gas is used throughout the process to effect oxide formation Which aids etching/removal. The oxygen also increases erosion of the mask layer. For best protection, thermal resistant thermoplastic water soluble polymers are chosen to mix with the thermal resistant and water soluble UV absorber.

Ideal candidates to perform as water soluble coating masks for plasma etching are high temperature thermoplastics which exhibit inert exposure results to simultaneous heat and oxygen exposure. As it is known that phenyl containing molecules exhibit thermal resistance over those which do not contain phenyl functionality, attention is given to such moieties. Polyester chemistries exhibit a history of thermal resistance and of being chemically inert. Certain polyesters which express water solubility are of interest. Those who are familiar in the art of polyester manufacturing are aware of crystalline products and those which are amorphous. The variety that represent amorphous quality are consistent with this invention, namely, the creation of a thermal resistant coating. Crystalline products, while being rigid with promising high glass transition (Tg) values to ensure the matrix is hard, the products are often brittle and will crack when subjected to handling and temperature cycling. The desired coating is desired to be a high strength thermoplastic which does not crack, is not brittle, and will not exhibit stress during curing or subjecting to temperature. Stress development should be avoided with any coating operation to ensure premature delamination or another issue due to the loss of adhesion. The desired coating should be an excellent film forming material to affix well to a broad range of materials and be able to undergo thermal cycling as is expected when interacted with a high temperature laser and subjected to high temperature plasma etching.

Polyester species as described in U.S. Pat. No. 4,480,085 (Larson) are water soluble sulfopolyesters that exhibit amorphous quality in film form. Use of phthalic acid derivatives with dicarboxylic acids to create amorphous polyesters. These polyesters are sourced as species to support the invention coating created to exhibit non-crystalizing quality. Other references to sulfopolyesters in U.S. Pat. Nos. 3,546,008, 3,363,942, 3,734,874, 3,779,993, and 3,828,010 discuss manufacturing metal sulfonate products with varying Tg values between 29-55 degrees centigrade. In some cases, the Tg is driven higher to >89 degrees centigrade, as in U.S. Pat. No. 5,369,211 (George, et al.) for applications where high temperature resistance may be needed. Patent WO 2013/012556 A1 discusses the diacid 5-sodiosulfoisopthalic acid (5-SSIPA), such sulfopolyesters are commercially available from Eastman Chemical Company under the tradename as Eastman AQ™ polymers. These polymers are identified as Eastman AQ™ 38S, 48, 55S, and 65S polymers with increasing Tg values from 38-63 degrees centigrade. All of the sulfopolyesters exhibit high thermal viscosities. For example, the Eastman AQ™ 55S exhibits values of 11.5m centipoise (cps), 2.3m cps, and 700k cps for temperatures 200, 240, and 280 degrees centigrade, respectively. The sulfopolyesters are essentially smooth and very hard (rigid) after curing. Unlike many other thermoplastics which exhibit a rapid drop in viscosity with temperature, the Eastman AQ™ products exhibit high viscosity and remain high, even with thermal exposure. Use of the Eastman AQ™ product as the thermal resistant water soluble polymer within the coating is 30-99%, preferred as 45-90%, and most preferred as 50-85%, being based upon the total weight of the solids being taken as % by weight.

A secondary thermal resistant water soluble polymer for use as a film forming agent includes homopolymers of 2-ethyl oxazoline. Reported thermal resistance for the product under the trademark "Aquazol®" by the company, Polymer Chemistry Innovations, Inc., located in Tucson Ariz., is over 380 degrees centigrade. There are a number of commercial molecular weights, noted as Aquazol®, 5, 50, 200, and 500, having MW as 5,000 g/M, 50,000 g/M, 200,0000/1 and 500,000 g/M. Thermal viscosity on the Aquazol® products are less than those for the Eastman AQ™ products, however, they remain high at between 5,000-300,000 cps for the range Aquazol® 5-500. The properties of thermal resistance, thermoplasticity, and water solubility are aids to this invention in creating an amorphous film with high adhesion and strength. While the higher MW forms of Aquazol® provide higher viscosity when dissolved into water, the key interest with the invention materials is to create a high solids % liquid concentrate, Therefore, it is desirable to use a lower MW form of Aquazol® as the 50 or even the 5. In this way, concentrations that approach 60% solids content can be created. Use of Aquazol® as the thermal resistant water soluble polymer within the coating is 30-99%, preferred as 45-90%, and most preferred as 50-85%, being based upon the total weight of the solids being taken as % by weight.

The film may also have a rinse aid as represented by a thermal resistant water soluble polymer. Styrene sulfonate polymers are chosen due to their thermal resistance existing >500 degrees centigrade. When adding styrene sulfonates to the film, thermal resistance is raised and water rinsability is favored. Appropriate forms of the styrene sulfonates exist as alkali element neutralized forms. These forms exist in various molecular weights between 10,000-1,000,000 g/M. The alkali forms as inorganic are represented as sodium, potassium, and lithium; as organic, the forms exist as amine or amino. The preferred styrene sulfonate form for use in the present subject matter may be lithium styrene sulfonate (LISS). Use of LISS as the rinse aid in the thermal resistant water soluble coating is 5-20%, and preferred as 10-15%, being based upon the total weight of the solids being taken as % by weight.

The desired coating is created as a liquid system in deionized water (DIW). The liquid comprises the thermal resistant water soluble polymer, thermal resistant water soluble UV compound, and a rinse aid. The total final target solids content within the aqueous liquid is 20-50%, preferred 30-45% and most preferred to be 35-40%, being based upon the total weight of all constituents and water being taken as % by weight. The manufacturing practice involves heating to 60-70 degrees centigrade within dedicated stainless steel equipment that is tared by weight, includes an impellor, hoses to bring the heated liquid out of the vessel and send through a series cartridge filtration system taken to <20 micron, preferred <10 micron, and most preferred <5 micron rated filter. Once through the filters, the liquid is returned to the mixing vessel where it is mixed with existing material and temperature is maintained. This filtration cycle is conducted for a minimum of 30 min, preferred 60 min (1 hr), and most preferred to be 2 hrs. Once the time period for the filtration cycling is completed, bottle filling begins. A retain is set aside for analytical. Quality control (QC) testing includes appearance, pH, solids assay, refractive index, specific gravity, viscosity, and coating thickness (microns) review (spin-coating).

The thermal resistant water soluble coating is commonly applied by spin coating practice using a spin range of 1,000-1,500 rpm. Typical coatings are very smooth with total thickness variation (TTV) determined from one side of the substrate to the other to be <5 microns, preferred <2 microns, and most preferred to be <1 micron. When coating a mirror finish substrate, the appearance of the coating is transparent with a smooth rainbow appearance over the surface of the substrate. Based upon customer feedback with equipment in use at the time of this writing, the typical coating thickness for laser interactive plasma singulation is chosen to be between 2-4 microns. This assumes a highly interactive laser process and selectivity of the thermal resistant water soluble coating to be >1,000:1, not including descum, removing any potential polymer irregularity in open areas.

The cured coating film is extremely hard and smooth. While it may be rigid, it is also strong, able to withstand force and shock during handling. When the surface is impacted or vibrated, no cracks appear in the structure, it remains smooth and uniform. The hardness of the coating provides a benefit to the rigid requirements of the invention, able to temper or relax the amorphous nature of the polymer mixture. The network increases the system's strength and alleviates problems of extreme hardness and risk of shattering upon vibration.

The UV absorber is most preferred as the fluorescent additive described earlier. The fluorescent dye offers the added benefit of existing as a screening tool for immediate identification. The fluorescent additive is detected with the aid of a simple observation microscope having a large focal distance and working area under the objective. With the microscope set-up in a normal observation mode, the specimen is put on the stage and a conventional UV emitting lamp is brought close to allow for excitation of the dye. The lamp may be an industrial variety having a large scattered UV type light bulb (365 nm emission, I-line) at 22 W (watts) or of similar characteristic. With the UV lamp turned on and all white light (conventional light) dimmed or turned off, the operator may observe fluorescence of a specific color of the chosen dye (typically light blue) at all locations where the dye is present. Therefore, this technique may be used to detect the presence of the coating on the substrate. During wafer inspection, the coated surface is observed, and where any dark or black location are indicated, these suggest the lack of coating and therefore, the possibility of a void, bubble, or other irregularity. In this case, proper wetting and penetration to microscopic areas in and around the devices on the substrate front side can be verified.

The coated substrate is sent to the laser patterning process. Once engaged, the tool inspects the substrate and locates alignment marks to set the substrate's reference locations to the systems internal software and programmed process. The laser produces ultraviolet radiation within 340-370 nm and preferred to be within 350-365 nm. This area of emission aligns with the absorption region of the UV absorber within the coating. Following the mask production to be completed within 1 cycle preferred, the wafer is sent to the plasma chamber where the same inspection occurs, alignment marks are found, and the system is coordinated to the substrate. A minimum level of process descum is performed to further clear the areas within the mask for the plasma etcher to ensure a high degree of uniformity. The chemical etch proceeds until full singulation is completed. The wafer is transferred to a cleans step where the thermal resistant water soluble coating is rinsed away with DIW. The washing occurs in a tool that offers a spin-rinse dry sequence. Following the cleans, the wafer is ready for the singulated die removal. Die are removed by a pick and place tool and are placed in trays or on tape and reel for shipment to the final location where the die will be installed within the component and tested.

Although the invention has been described in terms of particular embodiments, blends of one or more of the various additives described herein can be used, and substitutes therefore, as will be known to those skilled in the art. Thus the invention is not meant to be limited to the details described herein, but only by the scope of the appended claims.

EXAMPLES

The present subject matter is further illustrated, without limitation, by the following examples. In the examples #'s 1-9, the composition of the invention and applications are varied to achieve several objectives and to demonstrate versatility. Measurements are made by direct observations and data taken from tools common to most materials laboratories, and where necessary, optical microscopy or special instruments to gain knowledge of the properties of the final product.

Unless otherwise indicated, the substrates used are glass of thickness 1 mm, varying in geometry from about 100 um (100 micron=100×10e-6 meters) to 1000 um (1 millimeter). Application equipment includes spin-coater (Model CB100, Brewer Science, Inc., www.brewerscience.com), thickness profilometer (XP-1, Ambios Technology, Inc., www.ambiostech.com), an ultraviolet (UV) light source (Sylvania 365 nm, broad-band, 0.16 W/cm2-sec), and various other equipment that is common to a chemistry laboratory with application equipment. This equipment forms the basis for the survey to be conducted which the invention will be demonstrated.

The following items in Table 1 represent the specialty substances used to demonstrate the acrylic polymer temporary support structure.

TABLE 1

List of specialty substances used to demonstrate the invention.

| # | Material | Chemistry | Trade Name | CAS # | Manufacturer |
|---|---|---|---|---|---|
| 1 | (Base as polyester type) | Thermoplastic aromatic polyesters (PET) with measured melt viscosities | Eastman AQ ™ Polymers | Not Assigned | Eastman Chemical Corp. P.O. Box 431 Kingsport, TN 37662 USA |
| 2 | (Base as Polyvinyl alcohol, PVA) | Polyvinyl alcohol, (Mowiol ® 3-85, 85% hydrolyzed), thermoset at temperatures >100 C. | Mowiol ® Poval ® PVA-series | 9002-89-5 | Kuraray Co., Ltd. Ote Center Building, 1-1-3 Otemachi Chiyoda-ku, Tokyo 100-8115, Japan |
| 3 | Base as Polyvinyl pyrrolidone, (PVP) | Polyvinyl pyrrolidone, thermoset at temperatures >100 C. | PVP (K-values relative to MW & viscosity) | 9003-39-8 | Ashland, Inc. 50 East RiverCenter Blvd. Covington, KY 41012 USA |
| 4 | (Base as azole type) | poly-2-ethyl-2-oxazoline, thermoplastic with measured melt viscosities | Aquazol ™ (AQZ) | 25805-17-8 | Polymer Chemistry Innovations 4231 S. Fremont Avenue Tucson, AZ 85714 USA |
| 5 | (RA) Rinse aid polymer | Lithium styrene sulfonate (LISS), decomposes >330 C. | Spinomar ®-LISS | 4551-88-6 | TOSOH USA, Inc. 3600 Gantz Road Grove City, Ohio 43213 USA |
| 6 | (UVA) Ultraviolet absorber | Disodium distyrylbiphenyl disulfonate, organic dye | Keyfluor ™ White CBS-X | 27344-41-8 | Milliken & Company 920 Milliken Rd. Spartanburg, SC 29303 USA |

Example 1

Base Polymer Thermal Resistance

In this experiment, the water soluble polymers identified in Table 1 are tested for thermal resistance. All materials identified in Table 1 are water soluble. While all items #s 1-6 in Table 1 are water soluble polymers, we will focus on item #s 1-4, respectively as polyester (PET) as AQ™ Polymers, Polyvinyl alcohol (PVA) as Mowiol®, Polyvinyl pyrrolidone (PVP), and oxazoline as Aquazol™ (AQZ). These polymers are dissolved into water by mixing them within the range of their solubility with heating. The concentration of the respective polymer is chosen to be approximately 10-20% (wt %) in water. After dissolving, a given amount is applied by spin coating onto glass substrates of 1 mm thickness and geometric shape of 100 mm×100 mm. After coating, the substrates, each is transferred to a 100 degree centigrade hot plate and allowed to remain for 10 min to complete drying. A total of five (5) glass substrates for each coating is prepared. Each coated substrate is intended to be exposed to a series of hot plates each for 30 min of successively greater temperatures and finishing at the given temperature it is intended to represent. Temperatures range from 100 degrees centigrade to 300 degrees centigrade. For example, the first substrate is exposed to 100 degrees centigrade for 30 min, observed, and attempted to rinse/wash/soak with deionized water (DIW). Once DIW washing is completed, the substrate is finished with testing. The second substrate is exposed to 100 degrees centigrade for 30 min plus 150 degrees centigrade for 30 min (total 60 min), observed, and attempted to rinse/wash/soak with deionized water (DIW). The practice continues with the remainder of the series of substrates with higher temperatures adding 50 degrees centigrade each higher increment up to and including 300 degrees centigrade. A total of five substrates are thermal exposed as described and processed by rinse/wash/soak with DIW. The washing condition is non-agitation, a simple dip into room temperature DIW, allow to remain, and moving it back and forth in the water after 1-2 min immersion. This is repeated for each substrate and included in the observations. Results are stated in Table 2 (coating observations) and Table 3 (water washing).

TABLE 2

Results of base polymer thermal exposure. Polymers are described in Table 1, # is stated for each polymer base identified.

| Polymer | 100 C. | 150 C. | 200 C. | 250 C. | 300 C. |
|---|---|---|---|---|---|
| PET (#1) | Transparent | Transparent | Transparent | Discolor | Brown |
| PVA (#2) | Transparent | Discolor | Brown | Dk brown | Dk brown |
| PVP (#3) | Transparent | Discolor | Brown | Dk brown | Dk brown |
| AQZ (#4) | Transparent | Transparent | Discolor | Brown | Dk brown |

TABLE 3

Results of water washing of thermal exposed polymer coatings identified in Table 2.

| Polymer | 100 C. | 150 C. | 200 C. | 250 C. | 300 C. |
|---|---|---|---|---|---|
| PET (#1) | Clean | Clean | Clean | Clean | Clean |
| PVA (#2) | Clean | Not Clean | Not Clean | Not Clean | Not Clean |
| PVP (#3) | Clean | Not Clean | Not Clean | Not Clean | Not Clean |
| AQZ (#4) | Clean | Clean | Clean | Clean | Clean |

Both the polyester and azole polymer system exhibited reduced color development for a given temperature and responded better using DIW for washing.

Example 2

Use of Rinse Aid (RA)

In this experiment, a rinse aid identified in Table 1 (item #5) as lithium styrene sulfonate (LISS) is added to the base polymer to resist high temperatures and elicit improvement of room temperature water washing. The concentration of LISS added to the mixtures from Example 1 is approximately 25% of the total polymer in the solution, or a weight ratio of 1:3 for LISS:base polymer. In some cases, the solutions were reconstructed with the 1:3 ratio for LISS:base polymer and achieving. All mixtures were constructed with DIW as the carrier solvent. All solutions of the base polymers identified in Example 1 were created and applied to new glass substrates in the manner stated in Example 1. For simplicity, the extensive thermal exposures described in Example 1 were bypassed, using only 250 C as the exposure and if successful, a second set was prepared and tested at 300 C. Each was tested for a duration of 30 min. Similar results were collected as in Example 1, however, only for the stated temperatures, given in Tables 4 & 5.

TABLE 4

Results of 1:3 LISS:base polymer thermal exposed to 250 C. & 300 C. See Table #1 for explanation of the stated polymers.

| Polymer + 25% LISS | 250 C. | 300 C. |
|---|---|---|
| PET (#1) | Discolor | Discolor |
| PVA (#2) | Brown | Brown |
| PVP (#3) | Brown | Brown |
| AQZ (#4) | Discolor | Discolor |

TABLE 5

Results of water washing of thermal exposed polymer coatings identified in Table 4.

| Polymer + 25% LISS | 250 C. | 300 C. |
|---|---|---|
| PET (#1) | Clean | Clean |
| PVA (#2) | Not Clean | Not Clean |
| PVP (#3) | Not Clean | Not Clean |
| AQZ (#4) | Clean | Clean |

Improved DIW rinsing is observed from the PET and AQZ based polymer system with 25% LISS as RA. The PVA and PVP systems did not respond favorably with RA addition.

Example 3

Polyvinyl Alcohol (PVA) Compositions Testing for Thermal Resistance

In this example, coating chemistries created from PVA are dissolved into water by mixing and heating them within the range of their solubility. All PVA products are created to 20% (w/w) in DIW. The same mixtures of PVA products are segregated and partitioned such that part of their solution is mixed with rinse aid (RA) as lithium styrene sulfonate (LISS, item #5 Table 1) at 1:1 concentration such that the final cast polymer is represented as PVA:LISS=1:1 ratio as wt %. For reference, both PET and AQZ base polymer are included in the array. The PET and AQZ are mixed with LISS such that the final cast polymer mix is represented as 3:1 and 8:1 wt %, respectively, for PET:LISS and AQZ: LISS. After completing the mixtures, a given amount is applied by wiping the coating onto glass substrates of 1 mm thickness and geometric shape of 25 mm×75 mm (glass slides 1'X3"). The substrates are transferred to a 100 degree centigrade hot plate and allowed to remain for 10 min to complete drying. A total of three (3) glass substrates for each coating is prepared. Each coated substrate is exposed to a series of hot plates each for a given time and temperature. The conditions include 30 min @ 150 degrees centigrade, 30 min @ 250 degrees centigrade, and 10 hrs @ 250 degrees centigrade. The substrates are observed for their color and ability to wash with room temperature DIW. The washing condition is non-agitation, a simple dip into room temperature DIW, allow to remain, and moving it back and forth in the water after 15 min immersion. Results are stated in Table 6 (thermal exposure) and Table 7 (water washing).

TABLE 6

List of polymer coatings on glass and observations following thermal exposure.

| # | Description | 30 min @ 150 C. | 30 min @ 250 C. | 10 hrs @ 250 C. |
|---|---|---|---|---|
| 1 | PVA (Mowiol ® 4-98) | Clear, NC | Yel/brn | black |
| 2 | PVA (Poval ® PVA-403) | Clear, NC | Yel/brn | black |
| 3 | PVA (Mowiol ® 3-85) | Clear, NC | Yel/brn | black |
| 4 | PVA (Poval ® PVA-505) | Clear, NC | Yel/brn | black |
| 5 | PVA (Soln #1) + RA (item #5 Table 1), ratio as 1:1 w/w % polymer | Clear, NC | Clear, NC | black |
| 6 | PVA (Soln #2) + RA (item #5 Table 1), ratio as 1:1 w/w % polymer | Clear, NC | Clear, NC | black |
| 7 | PVA (Soln #3) + RA (item #5 Table 1), ratio as 1:1 w/w % polymer | Clear, NC | Clear, NC | black |
| 8 | PVA (Soln #4) + RA (item #5 Table 1), ratio as 1:1 w/w % polymer | Clear, NC | Clear, NC | black |
| 9 | PET (Item #1 Table 1) + RA (Item #5 Table 1), ratio 2:5 = 3:1 w/w % polymer | Clear, NC | Clear, NC | brown |
| 10 | AQZ, (Item #4 Table 1) + RA (Item #5 Table 1), ratio 1:5 = 8:1 w/w % polymer | Clear, NC | Clear, NC | brown |

TABLE 7

List of DIW rinse results of polymer coatings following thermal exposure in Table 6.

| # | Description | 30 min @ 150 C. | 30 min @ 250 C. | 10 hrs @ 250 C. |
|---|---|---|---|---|
| 1 | PVA (Mowiol ® 4-98) | Swells/diss* | No effect* | No effect* |
| 2 | PVA (Poyal ® PVA-403) | Diss* | Swells/diss* | No effect* |
| 3 | PVA (Mowiol ® 3-85) | Diss* | Swells* | No effect* |
| 4 | PVA (Poval ® PVA-505) | Diss* | Swells* | No effect* |
| 5 | PVA (Soln #1) + RA (item #5 Table 1), ratio as 1:1 w/w % polymer | Swells* | Swells* | Flakes* |
| 6 | PVA (Soln #2) + RA (item #5 Table 1), ratio as 1:1 w/w % polymer | Swells/diss* | Swells* | Flakes* |
| 7 | PVA (Soln #3) + RA (item #5 Table 1), ratio as 1:1 w/w % polymer | Swells/diss* | Swells* | Flakes* |
| 8 | PVA (Soln #4) + RA (item #5 Table 1), ratio as 1:1 w/w % polymer | Swells/diss* | Swells* | Flakes* |
| 9 | PET (Item #1 Table 1) + RA (Item #5 Table 1), ratio 2:5 = 3:1 w/w % polymer | Diss* | Diss* | Diss* |
| 10 | AQZ, (Item #4 Table 1) + RA (Item #5 Table 1), ratio 1:5 = 8:1 w/w % polymer | Diss* | Diss* | Diss* |

*Swells/diss = swells with minor dissolution; significant residue
*Diss = dissolves completely, all clean
*Swells = swells only, no dissolving observed
*No effect = coating is unchanged, no observed effect when exposed to DIW
*Flakes = no dissolution, only flakes, significant residue Example 3 demonstrates the loss of water solubility of PVA, likely due to its crosslinking, following thermal exposure to 250 degrees centigrade for 30 min, regardless of addition of RA (LISS). Comparing PET and AQZ base polymers, these substances retained their water solubility as demonstrated in their ability to rinse with DIW.

Example 4

Mixing PVA with Polyester & Testing Thermal Resistance & Rinsing

This experiment mixes polyester (PET) as AQ™ Polymers (item #1 Table 1) and Polyvinyl alcohol (PVA) as Poval® PVA-403 (item #2 Table 1) with rinse aid (RA) as lithium styrene sulfonate (LISS, item #5 Table 1). Solution appearance is recorded. The conditions of thermal exposure include 30 min @ 150 degrees centigrade and 30 min @ 250 degrees centigrade. Each substrate is observed for color change; a DIW water rinse exposure as described in Example 8 follows. The respective observations are given in Tables 8-9.

TABLE 8

Mixing PET and PVA polymers to create coatings on glass as specified in polymer solids in % wt and observations following thermal exposure.

| | Polymer solids ratio: | | | | Solution | Coating | Coating |
|---|---|---|---|---|---|---|---|
| # | PET | PVA | LISS | Total: | Appearance | 150 C. | 250 C. |
| 1 | 80.8% | 19.2% | 0.0% | 100.0% | Clr | Clr | Yel/brn |
| 2 | 49.2% | 50.8% | 0.0% | 100.0% | Clr | Clr | Yel/brn |
| 3 | 19.7% | 80.3% | 0.0% | 100.0% | Clr | Clr | Yel/brn |
| 4 | 60.7% | 14.5% | 24.8% | 100.0% | Cloudy | Clr | Yel/brn |
| 5 | 37.0% | 38.2% | 24.8% | 100.0% | Cloudy | Clr | Yel/brn |
| 6 | 14.8% | 60.4% | 24.8% | 100.0% | Clr | Clr | Yel/brn |

TABLE 9

List of DIW rinse results of polymer coatings in Table 8.

| | Polymer solids ratio: | | | | Coating | Coating |
|---|---|---|---|---|---|---|
| # | PET | PVA | LISS | Total: | 150 C. | 250 C. |
| 1 | 80.8% | 19.2% | 0.0% | 100.0% | swell/diss* | Flakes* |
| 2 | 49.2% | 50.8% | 0.0% | 100.0% | swell/diss* | Flakes* |
| 3 | 19.7% | 80.3% | 0.0% | 100.0% | swell/diss* | Flakes* |
| 4 | 60.7% | 14.5% | 24.8% | 100.0% | swell/diss* | Flakes* |
| 5 | 37.0% | 38.2% | 24.8% | 100.0% | swell/diss* | Flakes* |
| 6 | 14.8% | 60.4% | 24.8% | 100.0% | swell/diss* | Flakes* |

*Swells/diss = swells with minor dissolution; significant residue

*Flakes = no dissolution, only flakes, significant residue

Example 4 demonstrates the loss of water solubility in mixtures containing PVA as low as 15%, likely due to PVA crosslinking, following thermal exposure to 250 degrees centigrade for 30 min, regardless of addition of RA (LISS).

Example 5

Thermal Resistance of Base Polymer

This experiment tests the base polymer for thermal resistance by outgas, color change observed, and the ability to dissolve in deionized water (DIW) following maximum temperature exposure. No rinse aid is used in this experiment. The base polymers studied in this experiment are those commercialized as being water soluble coatings. These are identified further as items #1-4 in Table 1, respectively as polyester (PET) as AQ™ Polymers, Polyvinyl alcohol (PVA) as Mowiol®, Polyvinyl pyrrolidone (PVP), and oxazoline as Aquazol™ (AQZ). All coating mixtures are created at the same concentration, 20% polymer in DIW. The liquids are applied to glass substrates as described in previous examples and allowed to dry on a 100 degree C. hot plate. All coatings appear identical when dried at 100 degrees C.; all are transparent, clear. The coated glass substrates are transferred to hot plates at 150, 200, 250, and 300 degrees C. for 30 min each, except a longer time of 60 min is allowed at 300 degrees C. After each temperature, the substrates are removed and observed for their color and/or any morphology change. After the last 300 degrees C. exposure, the substrates are allowed to cool to room temperature and immersed half-way into a vessel containing DIW. Immersion is allowed for 30 min. Results are documented and presented in the following Tables 10-12.

TABLE 10

List of observations for each polymer coating and temperature exposure.

| # | Descript | Actual | 150 C. | 200 C. | 250 C. | 300 C. |
|---|---|---|---|---|---|---|
| 1 | PET (#1) | AQ48 20% | NC | NC | NC | Brn |
| 2 | PET (#1) | AQ48 20% | NC | NC | NC | Brn |
| 3 | PVA (#2) | PVA403 20% | NC | Yel/brn | Brn | dark Brn |
| 4 | PVA (#2) | PVA403 20% | NC | Yel/brn | Brn | dark Brn |
| 5 | PVP (#3) | PVPK15 20% | clr cracked | Yel cracked | Brn cracked | Brn cracked |
| 6 | PVP (#3) | PVPK15 20% | clr cracked | Yel cracked | Brn cracked | Brn cracked |
| 7 | AQZ (#4) | AQZ5 20% | NC | NC | slight yel | Brn |
| 8 | AQZ (#4) | AQZ5 20% | NC | NC | slight yel | Brn |

TABLE 11

List of measured outgas values for each polymer group, the average taken between 2 samples of each respective polymer. Each outgas measurement is a gravimetric weight loss for 30 min exposure at the cited temperature, while 300 degrees C. is 60 min. Each value is taken at that incremental temperature. A total is stated that represents an average between 2 cumulative values for the respective polymer.

| # | Descript | Actual | Ave 150 C. | Ave 200 C. | Ave 250 C. | Ave 300 C. | Total (Ave) |
|---|---|---|---|---|---|---|---|
| 1 | PET (#1) | AQ48 20% | 0.11% | 0.05% | −0.06% | 2.04% | 2.14% |
| 2 | PET (#1) | AQ48 20% | | | | | |
| 3 | PVA (#2) | PVA403 20% | 0.18% | 0.33% | 0.99% | 10.91% | 12.41% |
| 4 | PVA (#2) | PVA403 20% | | | | | |
| 5 | PVP (#3) | PVPK15 20% | −0.30% | 2.41% | 0.46% | 1.36% | 3.93% |
| 6 | PVP (#3) | PVPK15 20% | | | | | |
| 7 | AQZ (#4) | AQZ5 20% | −0.18% | 1.33% | 0.16% | 2.27% | 3.58% |
| 8 | AQZ (#4) | AQZ5 20% | | | | | |

TABLE 12

Observations of the polymer coating following the heat exposure to 300 degrees C. as stated in Table 11.

| # | Descript | Actual | 300 C. | DIW Soak |
|---|---|---|---|---|
| 1 | PET (#1) | AQ48 20% | Brn | diss * |
| 2 | PET (#1) | AQ48 20% | Brn | diss * |
| 3 | PVA (#2) | PVA403 20% | dark Brn | flakes * |
| 4 | PVA (#2) | PVA403 20% | dark Brn | flakes * |
| 5 | PVP (#3) | PVPK15 20% | Brn cracked | flakes * |
| 6 | PVP (#3) | PVPK15 20% | Brn cracked | flakes * |
| 7 | AQZ (#4) | AQZ5 20% | Brn | diss * |
| 8 | AQZ (#4) | AQZ5 20% | Brn | diss * |

* Diss = dissolves completely, all clean
* Flakes = no dissolution, only flakes, significant residue Example 5 presents another look at the loss of water solubility in base polymers PVA and PVP as their significant color change (brown, brn) and morphology changes (cracking) likely due to the polymer's crosslinking. The crosslinking process for PVA and PVP likely begins as low as 150 degrees centigrade (PVP cracking, Table 10). The base polymers PET and AQZ maintain water rinsing following thermal exposure to 300 degrees centigrade for 30 min. The PET and AQZ polymers have good thermal resistance as represented by low outgas measures <2% @ 250 C.

Example 6

Washable Base Polymer for Plasma Barrier Screening

It is of interest to evaluate the base polymer system for barrier quality in preventing penetration and attack by gaseous chemistry during plasma processing. The base polymer systems PET and AQZ types (see #1 & #4 in Table 1) with RA and UVA are applied by spin coating onto silicon wafer substrates, 150 mm diameter, whereby there are regions with aluminum metal pre-sputtered on the surface. The wafers are spin-coated until dried and staged for entering a plasma chamber system using a fluorine base chemistry. The gaseous plasma is allowed to be in contact with the wafers for a duration that is consistent with silicon etching processing. Once the process is completed, the wafers are removed, washed, and evaluated for deleterious attack by the gaseous fluorine. Results are given in Table 13.

TABLE 13

Evidence of pitting corrosion by fluorine atom chemistry within a plasma process. Base polymer reference is given in Table 1.

| Base polymer | Thickness (um) | Corrosion (attack of Al) |
|---|---|---|
| AQZ (#4 Table 1) | 2-3 | Attack, pitting |
| PET (#1 Table 1) | 2-3 | NC, safe |

It is observed the polyester (PET) base polymer exhibits barrier quality that is superior over that of the oxazoline (AQZ) chemistry.

Example 7

Coated Silicon Wafer for Plasma Selectivity Measurement

It is of interest to repeat test conditions in Example 6, however, only using the polyester base polymer and evaluate its plasma selectivity for a conventional silicon dry etching (fluorine) process. Silicon wafers are coated with the respective materials and subsequently processed by plasma etching. Selectivity is defined as the ratio of the distance of etch depth as compared to erosion (loss) of the polymer mask coating. The wafer coatings are spun dried with thickness measured and staged for entering a plasma chamber system. This gaseous chemistry is allowed to be in contact with the wafers for an extended duration. Once the process is completed, the wafer coatings are measured again and quantified. The wafer coatings are then washed with room temperature DIW and observed for cleans. Results are given below in Table 14.

TABLE 14

Measurement of polyester base polymer selectivity etch ratio in a plasma etch chemistry.

| Base Polymer | Film Thickness (um) | Film Loss (um) | Silicon etch (um) | Selectivity as Ratio (total process as Si:polymer) | DIW wash |
|---|---|---|---|---|---|
| PET #1 | 1.32 | 0.78 | 50 | 64:1 | Clean |

It is observed the polyester (PET) base polymer exhibits high barrier quality that presents selectivity as a washable mask allow plasma etching processes of silicon.

Example 8

Use of Ultraviolet Absorber (UVA) and Laser Interaction

Ultraviolet absorber (UVA) identified in Table 1 as item #6 (Disodium distyrylbiphenyl disulfonate) or Keyfluor™ CBS-X is added to specific base polymers with RA as LISS identified in Example 2 by % w relative to the system solids (polymer solids). The base polymers used are those proven for best washing experience following thermal exposure, including polyester (PET) as AQ™ Polymers and oxazoline as Aquazol™ (AQZ). The UVA has a known maxima absorption region in the UV/VIS range that extends from 350-370 nm. The amount of UVA is varied from a low of 2.4% to a high of >20% represented as wt % comparison to that of the cured polymer coating. See Table 5 below for more information on the exact UVA content. The chemistry was applied by spin coating onto silicon wafer substrates, 150 mm diameter. The substrate with cured coating was processed by a laser marking system. The system used is a 700 W single phase 355 nm laser (model #3500, DPSS Lasers, Inc.). It should be noted here that the UVA compound used has an absorption range that overlaps that of the laser, spreading from 300-425 nm with a maxima near 375 nm that encompasses the laser range of 343-355 nm. Five (5) passes are conducted with the laser using a cross-hatch pattern. Following laser processing, the pattern is observed under the aid of a microscope viewing the heat activation zone (HAZ), substrate impact area by the laser. This area is reviewed for irregularities, smoothness, and resolution of the laser cut into the substrate. The condition of the HAZ is based upon general smooth and consistent appearance. Once reviewed, the substrates are washed with room temperature DIW.

TABLE 15

Polymer coatings on silicon, processed by a laser marking system, with noted observations. Base polymer reference is made to Table 1.

| Base polymer | RA (%) | UVA (%) | Thickness (um) | HAZ | DIW Rinsing |
|---|---|---|---|---|---|
| AQZ #4 | 25% | 2.4% | 5.5 | Acceptable | Yes, fast |
| AQZ #4 | 25% | 2.4% | 18.8 | Acceptable | Yes, fast |
| AQZ #4 | 25% | 2.4% | 13.1 | Acceptable | Yes, fast |
| AQZ #4 | 25% | 12.6% | 5.6 | Acceptable | Yes, fast |
| AQZ #4 | 25% | 26% | 5.6 | Acceptable | Yes, fast |
| AQZ #4 | 25% | 40% | 5.6 | Acceptable | Yes, fast |
| PET #1 | 5% | 2.4% | 13.6 | Superior | Slow |
| PET #1 | 5% | 12.6% | 10.9 | Superior | Slow |
| PET #1 | 5% | 26% | 8.2 | Superior | Slow |
| PET #1 | 5% | 2.4% | 25.5 | Superior | Slow |
| PET #1 | 5% | 2.4% | 16.9 | Superior | Slow |

Best laser interaction for the coatings tested that contain base polymer PET and AQZ is obtained with PET. Rinsing is noticeably slower with the PET:RA systems (5% RA) as compared to the AQZ:RA (25% RA) polymer systems. Little difference is observed with variable UVA content as run on a simple laser marking system.

Example 9

Coated Silicon Wafers for Laser Assisted Plasma Etch Processing

This example investigates the performance of washable coatings of various compositions applied to a laser assisted plasma etch tool. Consistent with systems of this nature, coated silicon wafers are first patterned (producing a mask) using a high speed laser traveling across the coated substrate surface with the beam interacting with the coating. It is preferred to choose a low energy during laser processing. This allows the creation of the mask for subsequent plasma processing without laser damage to the substrate. In a preferred condition, the laser penetrates through the top coating of less than a few microns without deleterious effects to the substrate by melting or damaging the underlying material features. Using the laser for only "organic" interaction requires high selectivity between the laser and the organic coating without effects to the underlying substrate. Therefore, high selectivity (interaction) is preferred for laser with the organic coating. In this experiment, an array of organic coating compositions are created with varying concentrations of RA as LISS and UVA within the base polymer system, all of these are described in Table 1. This array is described in Table 16 below.

TABLE 16

Ingredient concentrations within base polymer.

| # | UVA | RA | Base | Base Type | Total: |
|---|---|---|---|---|---|
| 1A | 2.61% | 13.03% | 84.36% | PET | 100.00% |
| 1B | 2.44% | 24.39% | 73.17% | AQZ | 100.00% |
| 2A | 0.00% | 13.38% | 86.62% | PET | 100.00% |
| 2B | 1.32% | 13.20% | 85.48% | PET | 100.00% |
| 2C | 2.61% | 13.03% | 84.36% | PET | 100.00% |
| 2D | 5.08% | 12.70% | 82.22% | PET | 100.00% |
| 2E | 9.67% | 12.08% | 78.25% | PET | 100.00% |
| 3A | 2.63% | 0.00% | 97.37% | PET | 100.00% |
| 3B | 2.63% | 6.55% | 90.82% | PET | 100.00% |
| 3C | 2.63% | 13.03% | 84.34% | PET | 100.00% |
| 3D | 2.63% | 25.81% | 71.56% | PET | 100.00% |

The laser energy was controlled by its power and optical splitting to vary spot energy from 0.16-1.88 uJ. For a 2 um spot size, the energy of the laser varied from 80-940 uJ/mm. Laser energies vary according to the settings stated in Table 17.

TABLE 17

Energy settings for the laser as a spot and over a distance.

| Lane # | E/spot (uJ) | E/mm (uJ) |
|---|---|---|
| 1 | 0.16 | 80 |
| 2 | 0.2 | 100 |
| 3 | 0.28 | 140 |
| 4 | 0.38 | 190 |
| 5 | 0.5 | 250 |
| 6 | 0.5 | 250 |
| 7 | 0.62 | 310 |
| 8 | 0.75 | 375 |
| 9 | 0.88 | 440 |
| 10 | 1 | 500 |
| 11 | 1.12 | 560 |

Following the laser interaction with the substrate coating, the substrate is prepared and observed by scanning electron microscopy (SEM). As the laser interacts with the coating, a line or lane is formed across the wafer. Those coatings having higher levels of interaction will create deeper lanes, be more well defined, and rely less on subsequent cleaning of such areas in the descum step of the etch chamber. High interaction between the coating and the laser is considered to be complete. Laser interaction observed as complete is classified as: Y=yes, while less than satisfactory or no clearing of the coating within the lane is stated as N=No. Results of the laser interaction is given in Table 18.

TABLE 18

Lane clearing results from interaction of the laser at settings 1-11 with the coating compositions listed in Table 17.

| Coating | 1 | 2 | 3 | 4 | 5 | 6 | 7 | 8 | 9 | 10 | 11 |
|---|---|---|---|---|---|---|---|---|---|---|---|
| 1A | N | N | Y | Y | Y | Y | Y | Y | Y | Y | Y |
| 1B | Y | Y | Y | Y | Y | Y | Y | Y | Y | Y | Y |
| 2A | N | N | N | N | N | N | N | N | N | N | N |
| 2B | N | N | N | N | N | N | N | N | N | N | N |
| 2C | N | N | N | N | N | N | N | N | N | N | N |
| 2D | Y | Y | Y | Y | Y | Y | Y | Y | Y | Y | Y |
| 2E | Y | Y | Y | Y | Y | Y | Y | Y | Y | Y | Y |
| 3A | N | N | Y | Y | Y | Y | Y | Y | Y | Y | Y |
| 3B | N | N | Y | Y | Y | Y | Y | Y | Y | Y | Y |
| 3C | N | N | Y | Y | Y | Y | Y | Y | Y | Y | Y |
| 3D | N | N | Y | Y | Y | Y | Y | Y | Y | Y | Y |

Note:
Y = complete clearing; N = incomplete clearing.

The results of laser interaction suggests coating 1B, 2D, and 2E provide high interaction (selectivity) with the laser at low settings. A closer look at SEM images of these results suggest that while 1B may be clearing, it is not resolving well. Namely, the sidewalls are not as straight as that observed for 2D and 2E. With this, we may further list observations in a ranking with the lowest laser energy required to reach the substrate (lane clearing). These results are listed below in Table 19.

TABLE 19

Ranking of coating composition according to the minimum energy of the laser needed for lane clearing (completion), from lowest energy first to a condition of no clearing occurs.

| Coating (see Table 8) | E/spot (uJ) | E/mm (uJ) |
|---|---|---|
| 2D | 0.16 | 80 |
| 2E | 0.16 | 80 |
| 3D | 0.2 | 100 |
| 3B | 0.28 | 140 |
| 3C | 0.28 | 140 |
| 1A | 0.38 | 190 |
| 1B | 0.38 | 190 |
| 3A | 0.5 | 250 |
| 2C | 0.62 | 310 |
| 2B | 0.75 | 375 |
| 2A | None | None |

Coating compositions #2D and #2E represent the highest concentrations of UVA of the array of tested materials. These high concentrations align with the lowest spot energies of the laser, and therefore highest sensitivities. High sensitivity coatings allow low energy, low damaging laser powers for completing surface lanes (masking) that will lead to improved conditions on the next steps, plasma etching.

Example 10

DIW Rinsing of Coating Following Laser Assisted Plasma Etch Processing

The coated substrates generated from Example 9 (Table 18) following laser patterning and plasma etching are subsequently rinsed with room temperature DIW. Results after several minutes of rinsing are reviewed by microscopic analysis and reported as "Y" for full cleans, "P" for partial, and "N" for not clean in the following Table 20.

TABLE 20

Ingredient concentrations within base polymer and rinse results with RT DIW.

| # | UVA | RA | Base | Base Type | Rinse @ RT |
|---|---|---|---|---|---|
| 1A | 2.61% | 13.03% | 84.36% | PET | Y |
| 1B | 2.44% | 24.39% | 73.17% | AQZ | Y |
| 2A | 0.00% | 13.38% | 86.62% | PET | Y |
| 2B | 1.32% | 13.20% | 85.48% | PET | Y |
| 2C | 2.61% | 13.03% | 84.36% | PET | Y |
| 2D | 5.08% | 12.70% | 82.22% | PET | Y |
| 2E | 9.67% | 12.08% | 78.25% | PET | Y |
| 3A | 2.63% | 0.00% | 97.37% | PET | N |
| 3B | 2.63% | 6.55% | 90.82% | PET | P |
| 3C | 2.63% | 13.03% | 84.34% | PET | Y |
| 3D | 2.63% | 25.81% | 71.56% | PET | Y |

Coating compositions which contain AQZ water rinse immediately while only those PET coatings with >12% of RA as LISS achieved rinsing. Further, in conditions of PET base polymer without RA as LISS, these were observed to not rinse.

Example 11

Increase UVA Content in Coatings

This experiment tests the effects of raising the ultraviolet absorbing (UVA) compound added to the base polymer with review of solution and coating dynamics as well as thermal resistance color change and the ability to dissolve in deionized water (DIW) following maximum temperature exposure. The base polymers studied in this experiment include those commercialized as being water soluble coatings and shown to be thermal resistant to 250-300 degrees C. exposure. These are identified further as items #1 and #4 in Table 1, namely, polyester (PET) as AQ™ Polymers and oxazoline as Aquazol™ (AQZ). The UVA compound is cited as item #6 in Table 1, a thermal resistant UV absorbing and fluorescing compound, disodium distyrylbiphenyl disulfonate as Keyfluor™ White CBS-X (UVA). The mixtures are created in DIW at various solids containing sufficient amounts of UVA to produce coating compositions exceeding 60% w/w as UVA. These solutions are prepared and observed for stability at room temperature over a period of 2 days. The liquids are applied to glass substrates as described in previous examples and allowed to dry on a 100 degree C. hot plate. Observations are recorded in Tables 21 & 22 for reflecting solution stability and the coating condition. The coated glass substrates are then confirmed for visual fluorescence by a UV inspection lamp and then transferred to a hot plate set at 250 degrees C. for 30 min. After exposure, the substrates are removed and observed and tested again for visual fluorescence by a UV inspection lamp (absorption max=365 nm). The substrates are then immersed half-way into a vessel containing DIW and observed for ability to dissolve, results in Table 23.

TABLES 21 & 22

Solution preparations of UVA high loading with base polymers AQZ and PET.

| # | % Solids in Liq | % UVA in Liq | % AQZ in Liq | Soln Appear: | % UVA in Coating | % Imidazole in Coating | Coating: |
|---|---|---|---|---|---|---|---|
| 1 | 44.23% | 4.23% | 40.00% | Clr, smooth | 9.57% | 90.43% | Clr, smooth |
| 2 | 36.35% | 6.35% | 30.00% | Clr, smooth | 17.47% | 82.53% | Clr, smooth |
| 3 | 28.47% | 8.47% | 20.00% | Clr, smooth | 29.74% | 70.26% | Clr, smooth |
| 4 | 24.53% | 9.53% | 15.00% | Clr, smooth | 38.84% | 61.16% | Clr, smooth |
| 5 | 19.46% | 10.89% | 8.57% | Opaque * | 55.95% | 44.05% | Opaque * |
| 6 | 17.96% | 11.29% | 6.67% | Opaque * | 62.87% | 37.13% | Opaque * |

TABLES 21 & 22-continued

Solution preparations of UVA high loading with base polymers AQZ and PET.

| # | % Solids in Liq | % UVA in Liq | % PET in Liq | Soln Appear: | % UVA in Coating | % PET in Coating | Coating: |
|---|---|---|---|---|---|---|---|
| 7 | 28.02% | 2.82% | 25.20% | Opaque * | 10.07% | 89.93% | Opaque * |
| 8 | 24.52% | 5.08% | 19.44% | Opaque * | 20.72% | 79.28% | Opaque * |
| 9 | 22.03% | 6.68% | 15.35% | Opaque * | 30.34% | 69.66% | Opaque * |
| 10 | 19.83% | 8.11% | 11.72% | Opaque * | 40.89% | 59.11% | Opaque * |
| 11 | 18.33% | 9.07% | 9.26% | Opaque * | 49.49% | 50.51% | Opaque * |
| 12 | 16.64% | 10.16% | 6.48% | Opaque * | 61.06% | 38.94% | Opaque * |

* Opaque—cloudy, precipitation in liquid; white, non-transparent in coating

TABLE 23

Observations of coatings on glass from mixtures identified in Tables 21 & 22, visual fluorescence from UV lamp & washing after temperature exposure.

| Coating # | Base Poly | UVA (%) | Appearance | UV fluor* @ 100 C. | UV fluor* @ 250 C. | DIW Soak |
|---|---|---|---|---|---|---|
| 1 | AQZ | 9.57% | Clr, smooth | Yes | Yes | diss * |
| 2 | AQZ | 17.47% | Clr, smooth | Yes | Yes | diss * |
| 3 | AQZ | 29.74% | Clr, smooth | Yes | Yes | diss * |
| 4 | AQZ | 38.84% | Clr, smooth | Yes | Yes | diss * |
| 5 | AQZ | 55.95% | Opaque * | Yes | Yes | diss * |
| 6 | AQZ | 62.87% | Opaque * | Yes | Yes | diss * |
| 7 | PET | 10.07% | Opaque * | Yes | Yes | diss * |
| 8 | PET | 20.72% | Opaque * | Yes | Yes | diss * |
| 9 | PET | 30.34% | Opaque * | Yes | Yes | diss * |
| 10 | PET | 40.89% | Opaque * | Yes | Yes | diss * |
| 11 | PET | 49.49% | Opaque * | Yes | Yes | diss * |
| 12 | PET | 61.06% | Opaque * | Yes | Yes | diss * |

*UV fluor = observed visible fluorescence from UV inspection lamp

* Diss = dissolves completely, all clean

Driving up UVA content to achieve a coating with ≥60% wt is possible as shown in the observations of given solutions and the corresponding coatings (Tables 21-23). Solutions at 16-28% solids in liquid of base polymer PET with corresponding UVA content necessary to achieve 10-60% wt are opaque. Alternatively, similar corresponding UVA content ratio liquids with AQZ as the base polymer produced clear liquids and coatings from 24-44% solids liquids, while the corresponding solutions with a UVA content ratio necessary to achieve ≥55% are opaque. Possibilities to achieve high UVA contents are best achieved with AQZ base polymer. All coatings were shown to exhibit visible fluorescence before and after thermal exposure as measured by an inspection lamp, supporting that all absorbed at the given wavelength (365 nm).

Example 12

Increase UVA Content in Mixed Based Polymer Coatings

This experiment explores creating stable mixtures using both base polymers AQZ and PET as explained in the prior Example 11, keeping the UVA content high in the resulting coating. The objective is to achieve a dilution value that is stable for both of these base polymer systems with the respective UVA compound. As it is not the scope of this invention to investigate every possibility of mixing these base polymers AQZ and PET with the UVA, we will settle for simple mixtures of AQZ and PET which are at or near a weight % ratio of 1:1 while raising the content of the UVA and confirming the thermal resistance as color change and following with the ability to dissolve in deionized water (DIW). These mixtures follow on to Example 10 are created in DIW at various solids containing sufficient amounts of UVA to produce coating compositions exceeding 60% w/w as UVA. The base polymer mix of PET and AQZ varied as the ratio of these between 1:1 to 1:1.5 as PET:AQZ for the balance wt % from the UVA content. The liquids are applied to glass substrates as described in previous examples and allowed to dry on a 100 degree C. hot plate. The mixtures are then observed for stability at room temperature over a period of 2 days. Observations are recorded in Tables 24 & 25 for solution stability and the coating condition. The coated glass substrates are then confirmed for visual fluorescence by UV inspection lamp (absorption max=365 nm) and then transferred to a hot plate set at 250 degrees C. for 30 min. After exposure, the substrates are removed and observed and tested again for visual fluorescence by the same UV inspection lamp as performed earlier. The substrates are then immersed half-way into a vessel containing DIW and observed for ability to dissolve with results presented in Table 26.

TABLES 24 & 25

Solution preparations of UVA high loading with base polymers AQZ and PET.

| # | % Solids in Liq | % UVA in Liq | % PET in Liq | % AQZ in Liq | Soln Appear: | % UVA in Coating | % PET in Coating | % AQZ in Coating | Coating: |
|---|---|---|---|---|---|---|---|---|---|
| 13 | 36.13% | 3.53% | 12.60% | 20.00% | Opaque * | 9.76% | 34.88% | 55.36% | Clr, smooth |
| 14 | 30.44% | 5.72% | 9.72% | 15.00% | Opaque * | 18.78% | 31.94% | 49.28% | Clr, smooth |
| 15 | 25.25% | 7.58% | 7.67% | 10.00% | Opaque * | 30.00% | 30.39% | 39.60% | Partial * |
| 16 | 22.18% | 8.82% | 5.86% | 7.50% | Opaque * | 39.75% | 26.43% | 33.82% | Opaque * |
| 17 | 18.89% | 9.98% | 4.63% | 4.29% | Opaque * | 52.82% | 24.50% | 22.68% | Opaque * |
| 18 | 17.30% | 10.72% | 3.24% | 3.33% | Opaque * | 62.00% | 18.73% | 19.27% | Opaque * |
| 19 | 16.95% | 1.66% | 5.91% | 9.38% | Clr, smooth | 9.76% | 34.88% | 55.36% | Clr, smooth |
| 20 | 16.58% | 3.11% | 5.30% | 8.17% | Clr, smooth | 18.78% | 31.94% | 49.28% | Clr, smooth |
| 21 | 17.33% | 5.20% | 5.27% | 6.86% | Clr, smooth | 30.00% | 30.39% | 39.60% | Partial * |

TABLES 24 & 25-continued

Solution preparations of UVA high loading with base polymers AQZ and PET.

| # | % Solids in Liq | % UVA in Liq | % PET in Liq | % AQZ in Liq | Soln Appear: | % UVA in Coating | % PET in Coating | % AQZ in Coating | Coating: |
|---|---|---|---|---|---|---|---|---|---|
| 22 | 15.92% | 6.33% | 4.21% | 5.39% | Clr, smooth | 39.75% | 26.43% | 33.82% | Opaque * |
| 23 | 12.38% | 6.54% | 3.03% | 2.81% | Clr, smooth | 52.82% | 24.50% | 22.68% | Opaque * |
| 24 | 12.22% | 7.58% | 2.29% | 2.36% | Clr, smooth | 62.00% | 18.73% | 19.27% | Opaque * |

TABLE 26

Observations of coatings on glass from mixtures identified in Tables 24 & 25, visual fluorescence from UV lamp & washing after temperature exposure.

| Coating # | % Solids in Liq | AQZ % in Coating | PET % in Coating | UVA % in Coating | Coating Appearance | UV fluor* @ 100 C. | UV fluor* @ 250 C. | DIW Soak |
|---|---|---|---|---|---|---|---|---|
| 13 | 36.13% | 55.36% | 34.88% | 9.76% | Clr, smooth | Yes | Yes | diss * |
| 14 | 30.44% | 49.28% | 31.94% | 18.78% | Clr, smooth | Yes | Yes | diss * |
| 15 | 25.25% | 39.60% | 30.39% | 30.00% | Partial * | Yes | Yes | diss * |
| 16 | 22.18% | 33.82% | 26.43% | 39.75% | Opaque * | Yes | Yes | diss * |
| 17 | 18.89% | 22.68% | 24.50% | 52.82% | Opaque * | Yes | Yes | diss * |
| 18 | 17.30% | 19.27% | 18.73% | 62.00% | Opaque * | Yes | Yes | diss * |
| 19 | 16.95% | 55.36% | 34.88% | 9.76% | Clr, smooth | Yes | Yes | diss * |
| 20 | 16.58% | 49.28% | 31.94% | 18.78% | Clr, smooth | Yes | Yes | diss * |
| 21 | 17.33% | 39.60% | 30.39% | 30.00% | Partial * | Yes | Yes | diss * |
| 22 | 15.92% | 33.82% | 26.43% | 39.75% | Opaque * | Yes | Yes | diss * |
| 23 | 12.38% | 22.68% | 24.50% | 52.82% | Opaque * | Yes | Yes | diss * |
| 24 | 12.22% | 19.27% | 18.73% | 62.00% | Opaque * | Yes | Yes | diss * |

* Opaque-cloudy, precipitation in liquid; white, non-transparent in coating

*UV fluor = observed visible fluorescence from UV inspection lamp

* Diss = dissolves completely, all clean

Improved conditions of Example 11 are presented with mixing base polymers PET and AQZ. Increasing UVA content to achieve a coating with ≥60% wt is better achieved with a mixture of base polymers PET and AQZ at a maximum of 36% solids in liquid and diluted back to a max solids as 17% as shown in the observations of given solutions and the corresponding coatings (Tables 24-25). Base polymer mixtures of <17% solids in liquid with corresponding UVA content necessary to achieve 10-60% wt are all clear and stable at room temperature. All coatings were shown to exhibit visible fluorescence before and after thermal exposure as measured by an inspection lamp, supporting that all absorbed at the given wavelength (365 nm).

What is claimed is:

1. A composition useful as a thermal resistant water washable protective coating in laser machining, said composition comprising from about 5-50% by weight of a water soluble ultraviolet light absorbing compound, disodium distyrylbiphenyl disulfonate, and from about 30-85% by weight of at least one water soluble polymer selected from a group consisting of polyester and poly(2-ethyl-2-oxazoline), wherein the water soluble ultraviolet light absorbing compound and the at least one water soluble polymer are dissolved in water, said water soluble ultraviolet light absorbing compound and the at least one water soluble polymer percentages by weight being based upon the total weight of the solids taken as 100% by weight, wherein said water soluble ultraviolet light absorbing compound has a melting point greater than 250 degrees centigrade, and said at least one water soluble polymer is thermoplastic with a thermal viscosity at 200 degrees centigrade of greater than 50,000 centipoise.

2. The composition of claim 1, further comprising from about 5-20% by weight of a rinse aid, the weight % of the rinse aid being based upon the total weight of the solids taken as 100% by weight.

3. The composition of claim 2, wherein the rinse aid comprises a styrene sulfonate polymer.

4. The composition of claim 3, wherein the styrene sulfonate polymer has a molecular weight in the range of from 10,000 to 1,000,000 g/mol.

5. The composition of claim 3, wherein the styrene sulfonate polymer comprises lithium styrene sulfonate.

6. The composition of claim 1, wherein the weight % of the water soluble ultraviolet light absorbing compound that has a melting point greater than 250 degrees centigrade is 8-40% being based upon the total weight of the solids taken as 100% by weight.

7. The composition of claim 1, wherein the weight % of the water soluble ultraviolet light absorbing compound that has a melting point greater than 250 degrees centigrade is 10-30% being based upon the total weight of the solids taken as 100% by weight.

8. The composition of claim 1, wherein the at least one water soluble polymer comprises a mixture of the polyester and the poly (2-ethyl-2-oxazoline).

9. The composition of claim 1, wherein the composition is configured to form a coating having a thickness between 2 microns and 4 microns when applied by spin coating.

10. The composition of claim 1, further comprising from about 10-15% by weight of a rinse aid, the weight % of the rinse aid being based upon the total weight of the solids taken as 100% by weight.

11. The composition of claim 1, wherein the composition has a total solids content of 30-45% by weight based upon the total weight of all constituents and water.

* * * * *